US012646692B2

(12) United States Patent
Amend et al.

(10) Patent No.: US 12,646,692 B2
(45) Date of Patent: Jun. 2, 2026

(54) PLASMA PROCESSING METHOD AND PLASMA PROCESSING DEVICE

(71) Applicant: HITACHI HIGH-TECH CORPORATION, Tokyo (JP)

(72) Inventors: Andre Amend, Tokyo (JP); Kenichi Kuwahara, Tokyo (JP); Mamoru Yakushiji, Tokyo (JP)

(73) Assignee: Hitachi High-Tech Corporation, Tokyo (JP)

( * ) Notice: Subject to any disclaimer, the term of this patent is extended or adjusted under 35 U.S.C. 154(b) by 51 days.

(21) Appl. No.: 18/279,443

(22) PCT Filed: Apr. 13, 2022

(86) PCT No.: PCT/JP2022/017754
§ 371 (c)(1),
(2) Date: Aug. 30, 2023

(87) PCT Pub. No.: WO2023/199450
PCT Pub. Date: Oct. 19, 2023

(65) Prior Publication Data
US 2025/0029818 A1　　Jan. 23, 2025

(51) Int. Cl.
*H01J 37/32*　　(2006.01)
*H01L 21/311*　　(2006.01)

(52) U.S. Cl.
CPC .. *H01J 37/32697* (2013.01); *H01J 37/32715* (2013.01); *H01J 2237/3321* (2013.01); *H01J 2237/3346* (2013.01)

(58) Field of Classification Search
None
See application file for complete search history.

(56) References Cited

U.S. PATENT DOCUMENTS 4,702,795 A * 10/1987 Douglas ............ H01L 21/30655
438/719
6,093,332 A 7/2000 Winniczek et al.
(Continued)

FOREIGN PATENT DOCUMENTS

CN 103400800 A 11/2013
CN 103779203 A 5/2014
(Continued)

OTHER PUBLICATIONS

Search Report mailed Jul. 5, 2022 International Application No. PCT/JP2022/017754.
(Continued)

*Primary Examiner* — Shamim Ahmed
(74) *Attorney, Agent, or Firm* — Miles & Stockbridge, P.C.

(57) ABSTRACT

Provided is a plasma processing method and device capable of controlling the etching mask shape during a single-step process that etches a target material disposed below the etching mask. The plasma processing method includes performing selective deposition on the etching mask in separate phases, which are controlled via a periodic bias voltage signal. By tuning the bias voltage power, duration and timing, the mask height and width can be controlled and stabilized while etching on the substrate proceeds. Thus, the present method provides an etching process that allows fine control of the etching mask shape for small pattern sizes and provides high etching selectivity through deposition.

8 Claims, 10 Drawing Sheets

(56) References Cited

U.S. PATENT DOCUMENTS

| | | | |
|---|---|---|---|
| 8,969,211 | B2 | 3/2015 | Muto et al. |
| 10,121,640 | B2 | 11/2018 | Muto et al. |
| 2002/0125207 | A1 | 9/2002 | Ono et al. |
| 2005/0136682 | A1* | 6/2005 | Hudson ............. H01L 21/31116 |
| | | | 438/714 |
| 2008/0110859 | A1 | 5/2008 | Koshiishi et al. |
| 2010/0219158 | A1 | 9/2010 | Morikawa et al. |
| 2012/0021605 | A1 | 1/2012 | Omura et al. |
| 2012/0238100 | A1 | 9/2012 | Akiba |
| 2013/0157470 | A1 | 6/2013 | Watanabe et al. |
| 2014/0151327 | A1 | 6/2014 | Une et al. |
| 2014/0302682 | A1 | 10/2014 | Muto et al. |
| 2015/0048049 | A1 | 2/2015 | Nishimura et al. |
| 2015/0093903 | A1 | 4/2015 | Aoyama |
| 2015/0170880 | A1 | 6/2015 | Muto et al. |
| 2017/0140923 | A1 | 5/2017 | Watanabe et al. |
| 2018/0286697 | A1 | 10/2018 | Posseme et al. |
| 2020/0411286 | A1 | 12/2020 | Koshimizu et al. |
| 2022/0076962 | A1 | 3/2022 | Tan et al. |
| 2022/0384148 | A1 | 12/2022 | Yakushiji et al. |

FOREIGN PATENT DOCUMENTS

| | | | |
|---|---|---|---|
| CN | 104103486 | A | 10/2014 |
| CN | 106206307 | A | 12/2016 |
| JP | 2012-028431 | A | 2/2012 |
| JP | 2013-118359 | A | 6/2013 |
| JP | 2013-207089 | A | 10/2013 |
| JP | 2014-107520 | A | 6/2014 |
| JP | 2015-070232 | A | 4/2015 |
| JP | 2015-076490 | A | 4/2015 |
| JP | 2017-022136 | A | 1/2017 |
| JP | 2017-092376 | A | 5/2017 |
| KR | 10-2012-0104945 | A | 9/2012 |
| KR | 10-2014-0016920 | A | 2/2014 |
| KR | 10-2017-0057146 | A | 5/2017 |
| KR | 10-2018-0050743 | A | 5/2018 |
| WO | 2007135906 | A1 | 11/2007 |
| WO | 2012122064 | A1 | 9/2012 |
| WO | 2020176582 | A1 | 9/2020 |
| WO | 2021161368 | A1 | 8/2021 |

OTHER PUBLICATIONS

Written Opinion mailed Jul. 5, 2022 International Application No. PCT/JP2022/017754.

Office Action mailed Apr. 28, 2023 in Chinese Application No. 202080004046.4.

Office Action mailed Jan. 13, 2023 in Korean Application No. 10-2021-7001573.

Office Action mailed Feb. 24, 2023 in U.S. Appl. No. 17/277,812.

Search Report mailed Apr. 14, 2020 in International Application No. PCT/JP2020/005075.

Written Opinion mailed Apr. 14, 2020 in International Application No. PCT/JP2020/005075.

Office Action mailed Jan. 2, 2024 in Taiwanese Application No. 112106914.

Office Action mailed Oct. 18, 2024 in Korean Application No. 10-2023-7021682.

* cited by examiner

Process Time (After *n* Bias Voltage Cycles)

EXPECTED DEPOSITION RATES DURING DEPOSITION PHASES (BLANK) AND ETCHING PHASES (HATCHED)

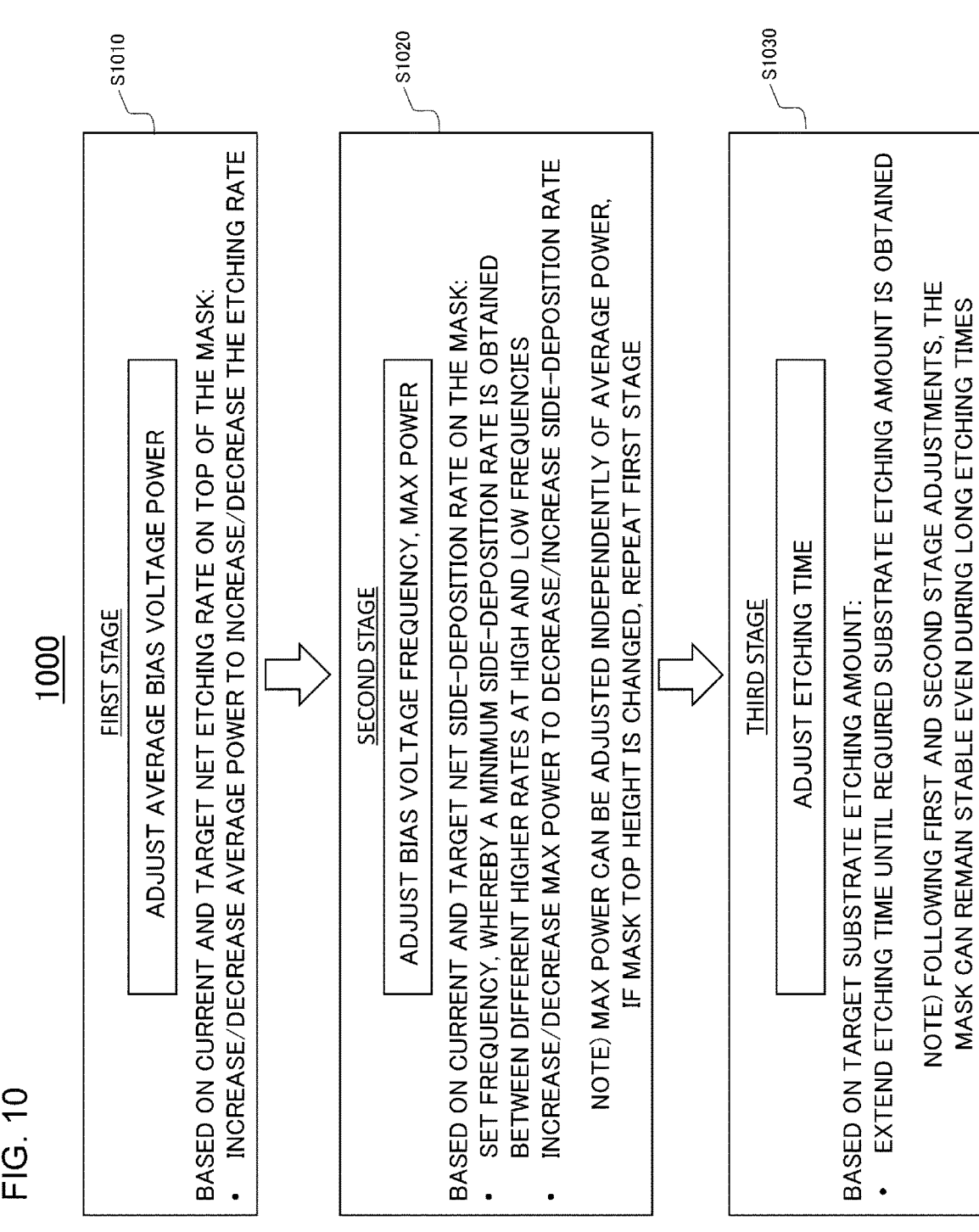

1000

FIRST STAGE

ADJUST AVERAGE BIAS VOLTAGE POWER

BASED ON CURRENT AND TARGET NET ETCHING RATE ON TOP OF THE MASK:
• INCREASE/DECREASE AVERAGE POWER TO INCREASE/DECREASE THE ETCHING RATE

S1010

SECOND STAGE

ADJUST BIAS VOLTAGE FREQUENCY, MAX POWER

BASED ON CURRENT AND TARGET NET SIDE-DEPOSITION RATE ON THE MASK:
• SET FREQUENCY, WHEREBY A MINIMUM SIDE-DEPOSITION RATE IS OBTAINED BETWEEN DIFFERENT HIGHER RATES AT HIGH AND LOW FREQUENCIES
• INCREASE/DECREASE MAX POWER TO DECREASE/INCREASE SIDE-DEPOSITION RATE

NOTE) MAX POWER CAN BE ADJUSTED INDEPENDENTLY OF AVERAGE POWER,
IF MASK TOP HEIGHT IS CHANGED, REPEAT FIRST STAGE

S1020

THIRD STAGE

ADJUST ETCHING TIME

BASED ON TARGET SUBSTRATE ETCHING AMOUNT:
• EXTEND ETCHING TIME UNTIL REQUIRED SUBSTRATE ETCHING AMOUNT IS OBTAINED

NOTE) FOLLOWING FIRST AND SECOND STAGE ADJUSTMENTS, THE
MASK CAN REMAIN STABLE EVEN DURING LONG ETCHING TIMES

S1030

PLASMA PROCESSING METHOD AND PLASMA PROCESSING DEVICE

TECHNICAL FIELD

The present invention relates to a plasma processing device and a plasma processing method.

BACKGROUND ART

The semiconductor device manufacturing industry has been largely characterized by a near constant trend of device miniaturization. This trend is continuing still, and the smallest sized feature half-pitch (that is, half the distance between identical features in a semiconductor array) is below 20 nanometers (nm) in current commercially manufactured devices. Following the introduction of new patterning technologies, such as EUV lithography with a high numerical aperture, the half-pitch is expected to reach 8 nm by 2028, according to IRDS, the International Roadmap for Devices and Systems™ (https://irds.ieee.org/editions/2021). Additionally, a more recent industry trend to increasingly utilize vertical structures with greater heights in device manufacturing necessitates etching processes that are capable of achieving greater etching depths. As a result of these trends, there is a need for manufacturing processes that can manufacture semiconductor structures with higher aspect ratios (AR); that is, semiconductor structures with smaller widths and greater depths.

In general, to create a pattern on a target substrate, it is necessary to etch it with an etching mask. To ensure pattern integrity, the etching mask must remain intact during the substrate etching until the required etching amount (EA) has been removed from the substrate. Accordingly, the etching rate of the etching mask during this etching process must be sufficiently low, or its height sufficiently large. If a large EA is required, it may be necessary to increase the height of the etching mask itself. However, since the height of the initial photoresist etching mask is limited by the requirements of photolithography, an etching process with a significantly lower etching rate at the etching mask than at the substrate (i.e., a high etching-selectivity) is necessary to compensate for the limited height of the etching mask and achieve large EAs.

For high AR etching, hard masks (HM) that have relatively high AR themselves, may be needed to achieve the required etching depth. Furthermore, it is necessary for such HMs to have high etching selectivity. In the case of etching silicon (Si), for example, hard masks may be made of silicon dioxide ($SiO_2$) or silicon nitride (SiN), among other materials. Because etching a tall IIM can be challenging, tri-layer structures are generally used to form etching masks with sufficient height to fabricate such IMs. As such, in order to achieve the target EA, etching masks with large heights are necessary, which may require additional processing steps to fabricate.

However, the above-described high AR fabrication process can be simplified, and thus improved, by devising etching processes that provide a higher etching selectivity of the HM material with respect to the etching mask. One possibility to extend an etching mask's effective selectivity is by depositing additional material on it to increase its height, which can be done by a process of selective deposition. However, depositing large amounts of material on an etching mask can change the shape of the etching mask and destabilize it due to side-deposition, increased height and weight, or the like. Such destabilization of the etching mask may lead to increased pattern roughness, or can even cause collapse or pinching-off (a phenomenon in which the upper side walls of the etching mask expand in a mushroom-like shape), which may negatively affect the etching result. Accordingly, in some cases, simple deposition is insufficient to increase the effective etching selectivity, because the etching mask pattern deteriorates before the necessary mask height can be obtained.

In view of the above, techniques for achieving desirable etching results have been considered.

As an example, WO2020/176582A1 (Patent Document 1) discloses "Provided herein are methods and related apparatus for mask reconstruction in an etch process. The methods involve depositing a sacrificial layer on the mask layer. The sacrificial layer may be used to protect portions of the mask layer during reshaping by inhibiting etching of or deposition on the mask layer. Following mask reshaping, the sacrificial layer may be removed using the same etch process that is used to etch the target material."

CITATION LIST

Patent Literature

[PTL 1]
WO2020/176582A1

SUMMARY OF INVENTION

Technical Problem

As described above, in order to reduce the overall process complexity that results from fabricating taller masks through etching, mask deposition can be used to increase the height of the etching mask, but this can affect the mask shape and lead to an undesirable etching result. In order to avoid deterioration of the etching mask caused by deposition, Patent Document 1 proposes a sequence of substrate etching and mask deposition followed by a mask reshaping process, in which the mask height and shape may be restored. This process involves selective deposition of a sacrificial layer on the top of the etching mask, etching of the mask overhang, and removal of the sacrificial layer in separate process steps. According to Patent Document 1, it is possible to use the described technique to reshape and repair the mask for pattern feature sizes greater than or equal to 20 nm. However, the technique described in Patent Document 1 relies on mask stability and pattern integrity, which become more difficult to control as pattern sizes decrease. As such, the technique described in Patent Document 1 has limited effectiveness for small pattern sizes.

In recent years, feature size miniaturization below 20 nm has increased the risk of flaws being introduced to the mask pattern by deposition. Such flaws may include, for instance, leaning and collapse of deposited mask walls and burying of the mask pattern after pattern spaces are pinched off by wall-deposition. Accordingly, direct deposition processes in which deposition amounts that are relatively large compared to the volume of the mask features become less useful, and have limited utility for small pattern sizes. Furthermore, in the case that one or more of the flaws described above occur, the mask pattern cannot be repaired using the technique described in Patent Document 1.

It is possible to avoid pattern degradation by reducing the duration of the deposition process, as doing so reduces the amount of deposition that is simultaneously present on the etching mask, thus reducing the risk of mask instability. In order to maximize the etching selectivity, it is desirable to reduce the etching process duration in accordance with the reduction in the deposition process duration, so as to not necessitate a subsequent larger deposition amount. As such, in order to compensate for the reduced duration of the deposition and etching processes, additional cycles of deposition and etching must be added in order to achieve the necessary EA.

However, as pattern miniaturization proceeds, the duration threshold for the deposition process that preserves the mask pattern decreases, thus leading to an increase in the number of separate process steps necessary to achieve the desired EA. This makes techniques reliant on simple deposition steps increasingly impractical for smaller patterns, because each step change introduces a non-scalable time delay due to the process gas exchange (that is, the process of switching between etching gases and deposition gases). Accordingly, in order to use deposition at small pattern sizes without dramatically increasing the process time, it is therefore necessary to stabilize the mask pattern by controlling the mask shape during deposition. By performing highly accurate mask deposition, it becomes possible to achieve high-quality results by increasing the effective etching mask selectivity with respect to the target material etching process even on small patterns below 20 nm.

Accordingly, in view of the above-described problems, it is an object of the present disclosure to provide a plasma processing method and a plasma processing device for controlling the etching mask shape while etching the substrate, thus achieving high etching mask selectivity and facilitating stabilization of the mask pattern for small feature sizes (e.g., under 20 nm).

Solution to Problem

One representative example of the present disclosure relates to a plasma processing method including providing, to a sample stage within a plasma processing chamber, a wafer including a substrate having an etching mask disposed on a target layer to be etched; providing a process gas to the plasma processing chamber to facilitate etching and deposition with respect to the wafer; and performing a combination etching and deposition process with respect to the wafer in which a bias voltage supplied to the sample stage with a first bias voltage frequency is modified between a first voltage value and a second voltage value lower than the first voltage value so as to satisfy a target net etching rate with respect to a top surface portion of the etching mask and a target net deposition rate with respect to a side wall portion of the etching mask.

Advantageous Effects of Invention

According to the embodiments of the present disclosure, it is possible to provide a plasma processing method and a plasma processing device for controlling the etching mask shape while etching the substrate, thus achieving high etching mask selectivity and facilitating stabilization of the mask pattern for small feature sizes (e.g., under 20 nm).

Problems, configurations, and effects other than those described above will be made clear by the following description of the embodiments for carrying out the invention.

BRIEF DESCRIPTION OF DRAWINGS

FIG. 10 is a diagram illustrating a flow of a parameter adjustment process according to the embodiments of the present disclosure.

DESCRIPTION OF EMBODIMENT(S)

Figure 1:
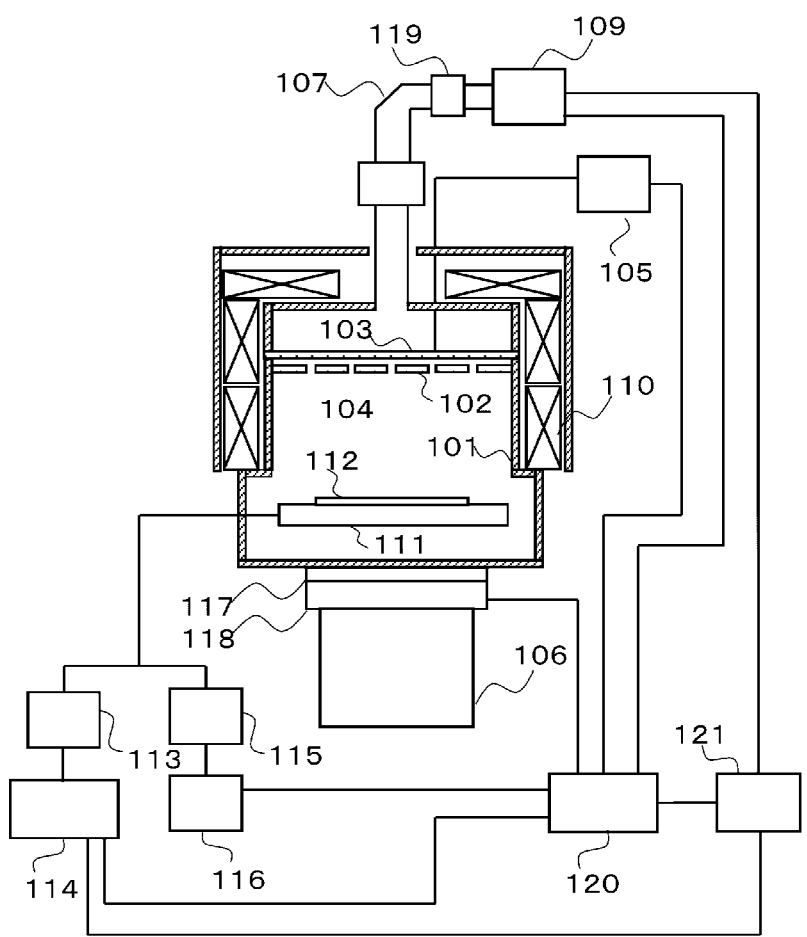
FIG. 1 is a diagram illustrating the hardware configuration of a plasma processing device according to the embodiments of the present disclosure.

Hereinafter, embodiments of the present invention will be described with reference to the Figures. It should be noted that the embodiments described herein are not intended to limit the invention according to the claims, and it is to be understood that each of the elements and combinations thereof described with respect to the embodiments are not strictly necessary to implement the aspects of the present invention.

Various aspects are disclosed in the following description and related drawings. Alternate aspects may be devised without departing from the scope of the disclosure. Additionally, well-known elements of the disclosure will not be described in detail or will be omitted so as not to obscure the relevant details of the disclosure.

The words "exemplary" and/or "example" are used herein to mean "serving as an example, instance, or illustration." Any aspect described herein as "exemplary" and/or "example" is not necessarily to be construed as preferred or advantageous over other aspects. Likewise, the term "aspects of the disclosure" does not require that all aspects of the disclosure include the discussed feature, advantage, or mode of operation.

Further, many aspects are described in terms of sequences of actions to be performed by, for example, elements of a computing device. It will be recognized that various actions described herein can be performed by specific circuits (e.g., an application specific integrated circuit (ASIC)), by program instructions being executed by one or more processors, or by a combination of both. Additionally, the sequence of actions described herein can be considered to be embodied entirely within any form of computer readable storage medium having stored therein a corresponding set of computer instructions that upon execution would cause an associated processor to perform the functionality described herein. Thus, the various aspects of the disclosure may be embodied in a number of different forms, all of which have been contemplated to be within the scope of the claimed subject matter.

As described herein, conventional etching techniques face challenges related to maintaining mask pattern stability for small feature sizes. Accordingly, aspects of the present disclosure relate to a plasma processing method and plasma processing device capable of performing etching and deposition within the same process step (e.g., a combination etching and deposition operation). A periodic bias signal that modulates the duration and frequency of the etching and deposition phases is tuned to control the height and width of the etching mask during the process, while the substrate, on which the deposition rate is lower, can be continuously etched.

According to the embodiments of the present disclosure, it is possible to provide a plasma processing method and a plasma processing device for controlling the etching mask shape while etching the substrate, thus achieving high etching mask selectivity and facilitating stabilization of the mask pattern for small feature sizes (e.g., under 20 nm). Such control of the mask shape may include setting a positive, a negative or zero amount of height change, and setting a positive or sufficiently small amount of width change. A detailed description of the embodiments of the present disclosure will be described below.

In the embodiments of the present disclosure, the shape of the etching mask and the etching selectivity during the substrate etching process are governed by controlling the bias voltage that is applied between the plasma and the substrate to be etched and the timing of the etching and deposition phases.

In general, the gas used to perform deposition (hereinafter referred to as "deposition gas") has a preference to deposit on the etching mask due to its material properties, and because the substrate is partially shielded by the etching mask. Furthermore, by performing fine control of the etching and deposition rates of the top surface and side walls of the etching mask, the change to the height and width of the etching mask can be mitigated. As a result, the pattern formed by the etching mask remains stable throughout the plasma processing operation while the substrate that is exposed by the mask pattern is etched. Put differently, by maintaining a balance between etching and deposition on the etching mask, while keeping the deposition rate, but not the etching rate, lower on the substrate, an effectively infinite etching selectivity can be achieved, and the integrity of the etching mask can be preserved even for small feature sizes.

Turning now to the Figures, the hardware configuration of a plasma processing device according to the embodiments of the present disclosure will be described with reference to FIG. 1.

FIG. 1 is a diagram illustrating the hardware configuration of a plasma processing device 100 according to the embodiments of the present disclosure. The plasma processing device 100 is the apparatus used to perform the plasma processing operation according to the embodiments of the present disclosure, and may include, for instance, an electron resonance (ECR) microwave plasma etching device, however the present disclosure is not limited hereto.

As illustrated in FIG. 1 in the plasma processing device 100, a shower plate 102 for supplying a process gas into a vacuum container 101 and a dielectric window 103 are installed in the upper portion of the vacuum container 101. In embodiments, the shower plate 102 and the dielectric window 103 may be formed of quartz, for example. The upper portion and the connected vacuum container 101 are sealed to form a plasma processing chamber 104. A gas supply device 105 for providing a flow of process gas is connected to the shower plate 102. Here, the process gas may include a mixture of a diluent gas, an etching gas, and a deposition gas.

Further, a vacuum exhaust device 106 is connected to the vacuum container 101 via an exhaust on-off valve 117 and an exhaust rate variable valve 118. The inside of the plasma processing chamber 104 is depressurized by opening the exhaust on-off valve 117 and driving the vacuum exhaust device 106, and is brought into a vacuum state in which the pressure is reduced from atmospheric pressure. The pressure in the plasma processing chamber 104 is adjusted to a desired pressure by using the exhaust rate variable valve 118.

The process gas is supplied from the gas supply device 105 into the plasma processing chamber 104 via the shower plate 102, and is exhausted by the vacuum exhaust device 106 via the exhaust rate variable valve 118. A sample mounting electrode 111, which serves a sample stage, is provided at the lower portion of the vacuum container 101 so as to face the shower plate 102.

In order to supply a radio frequency power signal (a first radio frequency power signal) for generating plasma to the plasma processing chamber 104, a waveguide 107 configured to transmit an electromagnetic wave is provided above the dielectric window 103. The electromagnetic wave to be transmitted to the waveguide 107 is oscillated from an electromagnetic wave generating power supply 109, which is a microwave power supply, via a matching unit 119. A pulse generating unit 121 is attached to the electromagnetic wave generating power supply 109, whereby microwaves can be pulse-modulated at any set repetition frequency. The frequency of the electromagnetic wave is not particularly limited, and in the present embodiment, a microwave of 2.45 GHz is used.

A magnetic field generating coil 110 that generates a magnetic field is provided outside the plasma processing chamber 104. By interaction with the magnetic field generated by this magnetic field generating coil 110, the electromagnetic wave oscillated from the electromagnetic wave generating power supply 109 generates high density plasma in the plasma processing chamber 104, and etching and deposition can be performed on a wafer 112 disposed on the sample mounting electrode 111.

The shower plate 102, the sample mounting electrode 111, the magnetic field generating coil 110, the exhaust on-off valve 117, the exhaust rate variable valve 118, and the wafer 112 are disposed coaxially with respect to the central axis of the plasma processing chamber 104, and therefore a flow of the process gas, the radicals and ions generated by the plasma, and the reaction products generated by the etching are coaxially supplied to the wafer 112 and exhausted. By means of this coaxial arrangement, the uniformity of the etching rate and the etching shape on the plane of the wafer 112 is near axial symmetry, and the uniformity of the wafer processing can be increased.

The sample mounting electrode 111 is coated with a sprayed film (not illustrated in the Figures) on an electrode surface thereof, and is connected to a DC power supply 116 via a radio frequency filter 115. Further, a radio frequency bias power supply 114 is connected to the sample mounting electrode 111 via a matching circuit 113. The radio frequency bias power supply 114 is connected to the pulse generating unit 121 and can selectively supply a time modulated radio frequency power signal (a second radio frequency power signal) to the sample mounting electrode 111. The frequency of the radio frequency bias is not particularly limited, and in the present embodiment, a radio frequency bias of 400 kHz is used.

A control unit 120 that controls the above-mentioned plasma processing device 100 controls a repetition frequency or a duty ratio including an on/off timing of pulses of the electromagnetic wave generating power supply 109, the radio frequency bias power supply 114, and the pulse generating unit 121, as well as etching parameters such as a gas flow rate, a processing pressure, a microwave power, a radio frequency bias power, a coil current, a pulse-on time, and a pulse-off time for performing etching. In embodiments, the control operations performed by the control unit 120 may be performed based on user inputs received via an input unit (not illustrated in the Figures) connected to the plasma processing device 100.

The duty ratio controlled by the control unit 120 is the ratio of the on-period to one full period of the pulse. In the present embodiment, the repetition frequency of the pulse can be changed from 10 Hz to 2 kHz, and the duty ratio can be changed from 2% to 90%. Further, the setting of the time modulation may be an on-period or an off-period.

Next, an example of a radio frequency bias voltage will be described with reference to FIG. 2.

Figure 2:
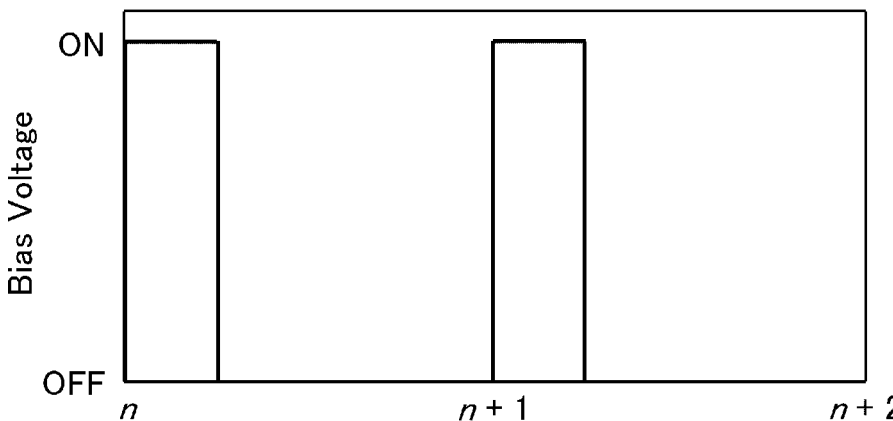
FIG. 2 is a graph illustrating a schematic of a radio frequency bias voltage during two cycles, according to the embodiments of the present disclosure.

FIG. 2 is a graph illustrating a schematic of a radio frequency bias voltage during two cycles, according to the embodiments of the present disclosure. The cycle duration is the reciprocal of the bias voltage frequency. Here, the bias voltage duty ratio is 25%, thus its on-phase lasts for a quarter of the duration of each cycle, while the remainder is its off-phase. For the radio frequency bias voltage, the power generating the voltage during the on-phase is called the maximum bias voltage power, and the maximum power multiplied by the duty ratio is called the average bias voltage power. In the example of FIG. 2, the average bias voltage power is a quarter of the maximum bias voltage power.

Next, an embodiment in which the above-described plasma processing device 100 is used to perform the plasma processing operation according to the present disclosure will be described with reference to FIG. 3 to FIG. 9. In the present disclosure, a "plasma processing operation" refers to an operation in which a combination etching and deposition operation is performed with respect to a wafer. More particularly, a processing gas that is a mixture of a diluent gas, an etching gas, and a deposition gas is supplied to the plasma processing chamber of the plasma processing device 100, and by alternating the bias voltage supplied to the sample stage between a high value and a low value, the effects of the etching process and the deposition process become dominant in alternating phases. Accordingly, by appropriately adjusting the bias voltage as well as the other etching parameters, the etching rates and deposition rates can be controlled with a high degree of accuracy to maintain the height and width of the etching mask within desired ranges.

The following description will be made with reference to an example in which etching was performed using a mixed gas containing Argon (Ar), carbon tetrafluoride (CF$_4$), and methane (CH$_4$) gas under conditions of a predetermined gas pressure, microwave power supply power, radio frequency bias voltage supply power, frequency, and duty ratio, as illustrated in Table 1 below. However, it should be noted that this example is merely provided for illustration, and the embodiments of the invention are not limited to the following conditions, and may be modified as necessary. For example, favorable results can be obtained in cases in which the gas flow rate of the etching gas is 3-15 times the gas flow rate of the deposition gas.

TABLE 1

| Ar gas | 448 mL/min |
|---|---|
| CF$_4$ gas | 70 |
| CH$_4$ gas | 12 |
| Gas pressure | 0.8 Pa |
| Microwave power supply power | 800 W |
| Radio frequency bias power | 88-400 W |
| Radio frequency bias frequency | 10-400 Hz |
| Radio frequency bias duty | 14-50% |

Figure 3:
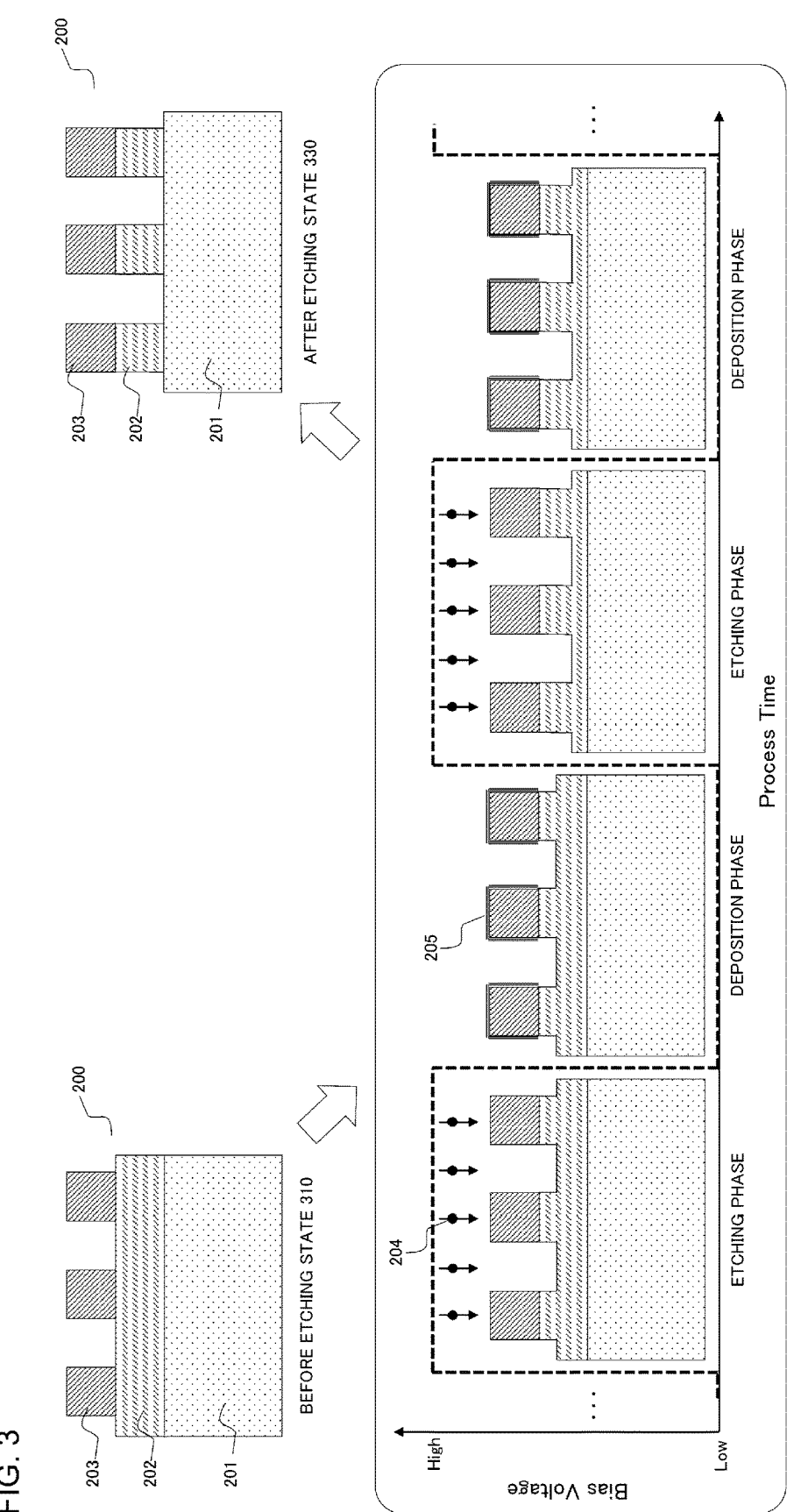
FIG. 3 is a diagram illustrating the flow of a plasma processing operation according to the embodiments of the present disclosure in a case in which a spin-on carbon (SOC) layer is used as the mask material.

FIG. 3 is a diagram illustrating the flow of a plasma processing operation according to the embodiments of the present disclosure. FIG. 3 includes diagrams illustrating a before etching state 310, a during etching state 320, and an after etching state 330. The plasma processing operation according to the present embodiments proceeds in the direction of the arrows illustrated in FIG. 3, from the before etching state 310 to the during etching state 320 and finally to the after etching state 330.

As illustrated in the before etching state 310 of FIG. 3, for instance, a wafer 200 comprising a substrate 201 on which an etching material 202 and an etching mask 203 are respectively arranged is disposed on the sample mounting electrode 111 at the lower portion of the vacuum container 101 of the plasma processing device 100 illustrated in FIG. 1. Here, in the present example, a configuration in which the substrate 201 is formed of silicon (Si), the etching material 202 is formed of silicon dioxide (SiO$_2$), and the etching mask is a spin-on carbon (SOC) layer will be described as an example, although the present embodiments are not limited hereto. After completion of the plasma processing operation, the etching rates of the etching material 202 and the etching mask 203 may be evaluated by cleaving the sample and observing them with a scanning electron microscope (SEM).

During the etching state 320, a radio frequency bias voltage (hereinafter referred to as a "bias voltage") with a certain maximum power, duty ratio and frequency is applied to the wafer 200. Here, the bias voltage is periodically modified between a high value (a first voltage value) and a low value (a second voltage value). In the phase in which the bias voltage is applied with the high value (e.g., the maximum bias voltage value), etching occurs due to accelerated ions 204 from the gas plasma being accelerated towards the etching mask 203 and the etching material 202. In contrast, in the phase in which the bias voltage is applied with the low value (e.g., a minimum value, such as 0), deposition occurs. Here, due to the material properties of the etching mask 203, and because the substrate 201 is partially shielded by the etching mask 203, the deposition gas has a preference to deposit on the etching mask 203, and thus a greater amount of deposition takes place on the etching mask 203 than the substrate 201, creating a thin deposition layer 205.

The parameters of the bias voltage (hereinafter referred to as "etching parameters") such as the average power, maximum power, frequency, and duty ratio can be used to control the deposition and etching processes on the etching mask 203. In the plasma processing operation according to the embodiments of the present disclosure, these etching parameters are set such that the etching process and the deposition process largely cancel each other's effects, such that the amount of change to the shape of the etching mask 203 that occurs after many bias voltage pulses is reduced. In this way, by alternating the bias voltage between high and low values with predetermined etching parameters, the effects of the deposition and etching phases on the etching mask 203 can be controlled to obtain a larger net etching rate for the etching material 202 than the etching mask 203, and maintain the height and width of the etching mask 203 within a desired range. As a result, the height and width of the etching mask 203 can remain virtually unchanged through the plasma processing operation.

Furthermore, as the etching and deposition processes are performed in a combined etching and deposition operation in which both etching and deposition gases are present in the plasma processing chamber, it becomes unnecessary to perform a process gas exchange to switch between etching and deposition gases. As a result, the time delay resulting from this process gas exchange can be avoided, such that the plasma processing operation can be performed in a swift and efficient manner.

Figure 4:
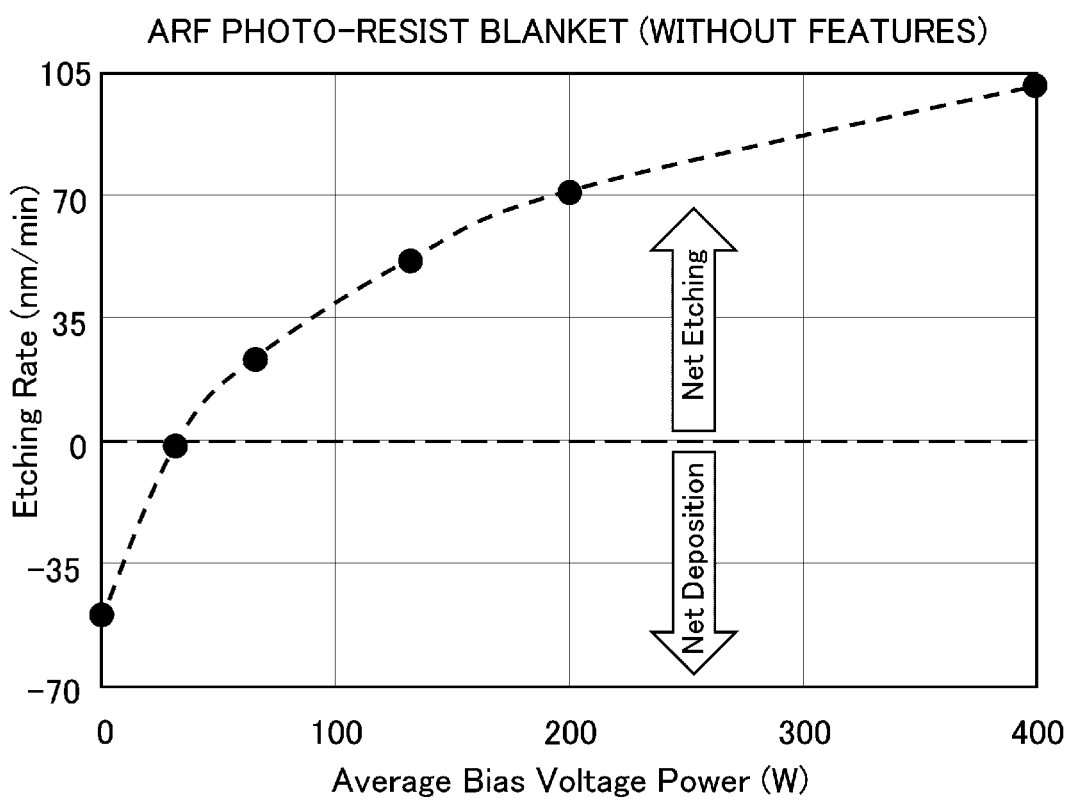
FIG. 4 is a graph illustrating an etching rate of the plasma processing operation according to the embodiments of the present disclosure on an ArF photo-resist blanket wafer at different average bias voltage powers at a bias voltage frequency of 100 Hz.

FIG. 4 is a graph illustrating an etching rate of the plasma processing operation according to the embodiments of the present, disclosure on an ArF (argon fluoride) photo-resist blanket wafer at different average bias voltage powers at a bias voltage frequency of 100 Hz. FIG. 4 illustrates the relationship between the average bias voltage power, which is the product of the maximum bias voltage power and its duty ratio, and the etching rate of carbon-based materials. A wide range of average bias voltage power is illustrated in FIG. 4, where the results from a ArF photo-resist layer without features are plotted. More particularly, FIG. 4 includes the results obtained from a case in which the bias voltage was periodically turned off (that is, an average power of 0 W) and periodically turned on (an average power of 400 W). As illustrated in FIG. 4, the net etching rate of the wafer reaches zero at a certain average bias voltage power. In the case of the present example, the average bias voltage power at which the net etching rate reaches zero was found to be 32 W.

Figure 5:
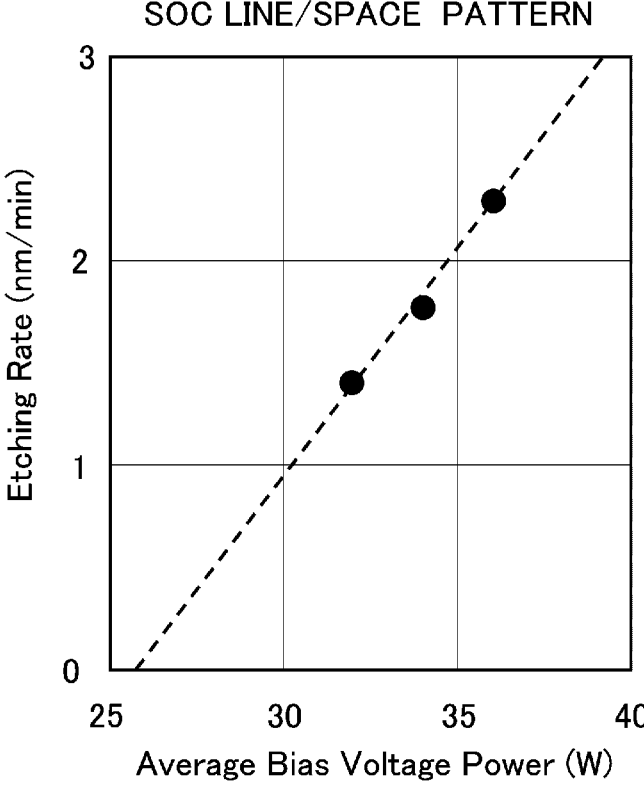
FIG. 5 is a graph illustrating an etching rate of the plasma processing operation according to the embodiments of the present disclosure on the top of an SOC etching mask at different average bias voltage powers at a bias voltage frequency of 100 Hz.

FIG. 5 is a graph illustrating an etching rate of the plasma processing operation according to the embodiments of the present disclosure on the top of an SOC etching mask at different average bias voltage powers at a bias voltage frequency of 100 Hz. FIG. 5 illustrates a narrower range of average bias voltage power values, in which the etching rates on top of a line and space pattern SOC mask are plotted.

In general, for an etching mask with both a top surface portion and side wall portions (such as the one illustrated in FIG. 3), the etching rate due to the bias voltage is greatest on the top surface portion, which lies directly within the path-of-flight of the accelerated ions. Because the etching rate on the top surface portion of the etching mask is strongly affected by the average power of the bias voltage, by adjusting the average power of the bias voltage, the etching rate on the top surface portion can be modified to a desired value. In FIG. 5, at the point where the etching rate approaches zero, it is possible to achieve a high degree of control over the etching rate (for example, within 1 nm per minute) by fine-tuning of the average bias voltage power.

In the above-described FIG. 4 and FIG. 5, a net etching rate of zero indicates that the effects of the etching and deposition processes on the etching mask cancel each other out, such that the amount of material etched from the etching mask by the etching process is substantially equal to the amount of material deposited on the etching mask by the deposition process. Accordingly, by setting the average bias voltage power to an appropriate value, it is possible to achieve a net etching rate of substantially zero on the top surface portion of the etching mask, and thereby maintain its height at a constant value.

As described herein, by setting the average bias voltage power to an appropriate value, it is possible to maintain the height of the etching mask. However, in order to ensure pattern integrity, in addition to maintaining the height of the etching mask, it is likewise desirable to control the etching rate on the side wall portions of the etching mask. Accordingly, the relationship between the side wall deposition rates (e.g., a second etching rate) on an etching mask will be described with reference to FIG. 6.

Figure 6:
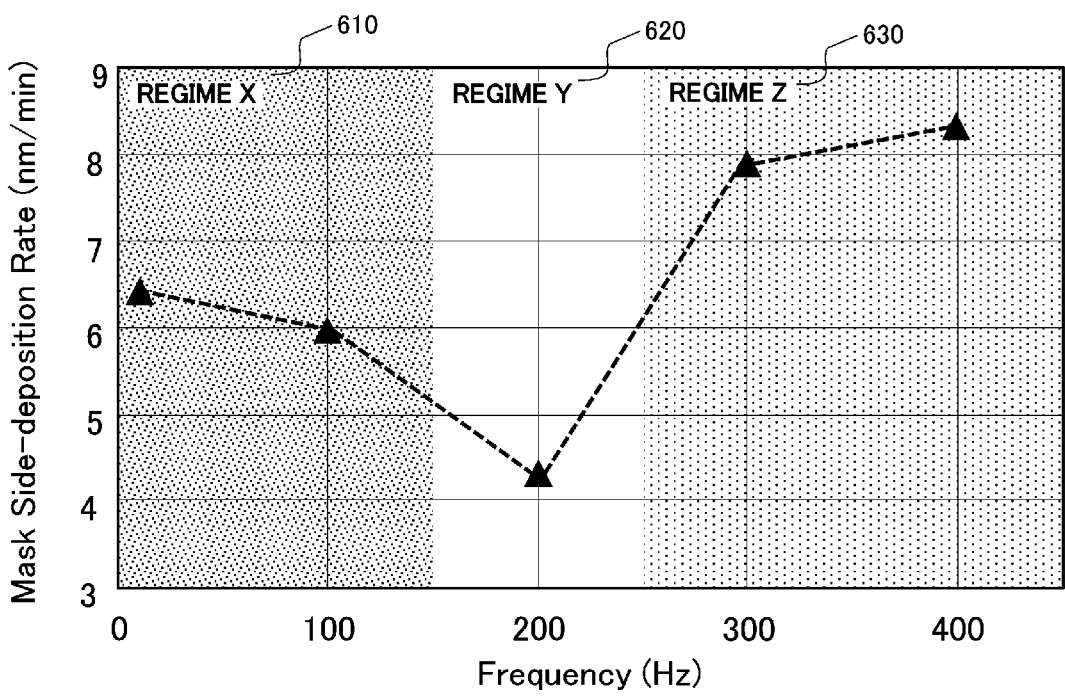
FIG. 6 is a graph illustrating the lateral deposition rate on the walls of the SOC etching mask at different bias voltage frequencies at a bias voltage power of 200 W and a duty ratio of 20%.

FIG. 6 is a graph illustrating the lateral deposition rate on the walls of the SOC etching mask at different bias voltage frequencies at a bias voltage power of 200 W and a duty ratio of 20%. By adjusting the bias voltage frequency, it is possible to modify the duration of the bias voltage cycle (including the duration of the deposition and etching phases), and thus control the side wall deposition rates on the etching mask.

As a result of the present inventors' research regarding the relationship between the side wall deposition rate of the etching mask and the bias voltage frequency, three frequency regimes were identified. As illustrated in FIG. 6, these include Regime X 610, where the side wall deposition rate of the etching mask decreases with increasing bias voltage frequency; Regime Y 620, where a minimum in the side wall deposition rate of the etching mask is reached; and Regime Z 630, where the side wall deposition increases with increasing bias voltage frequency. The details of each of the frequency regimes will be described with respect to FIG. 7.

Figure 7:
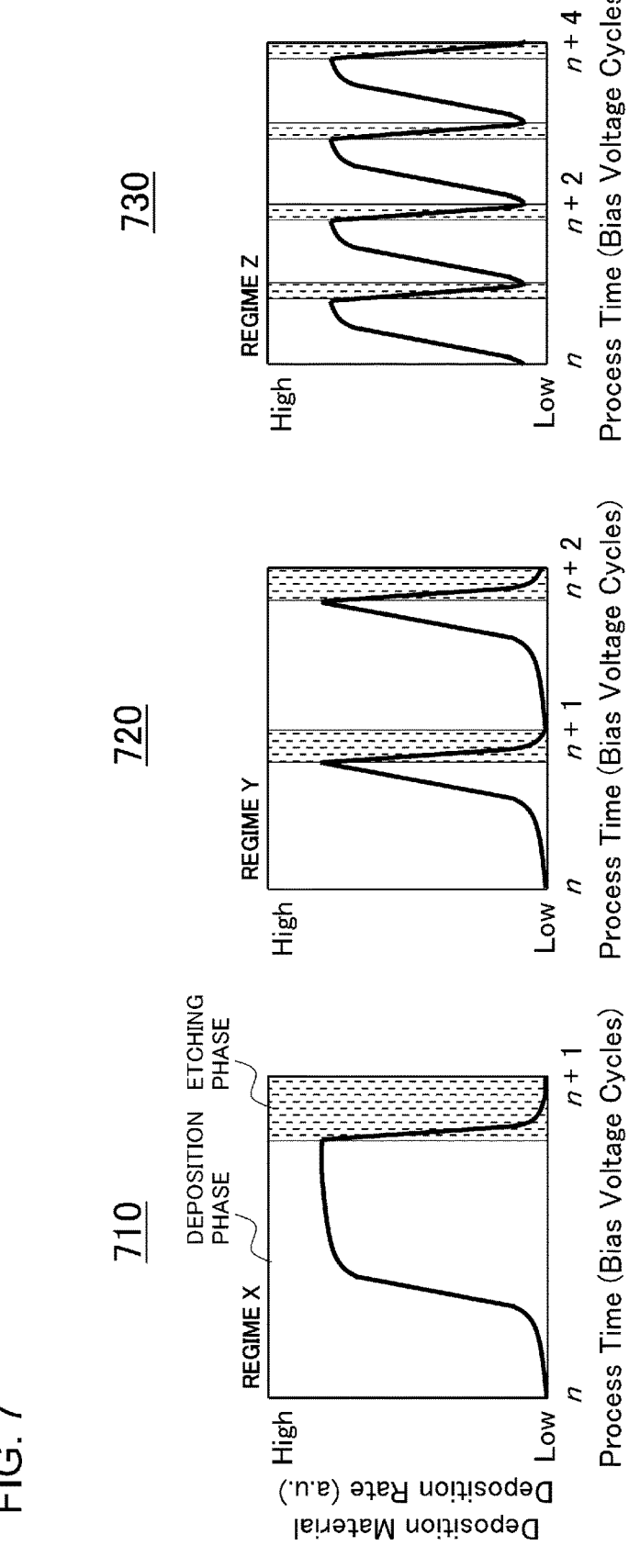
FIG. 7 is a diagram illustrating a series of graphs that show the deposition rate on the etching mask during bias voltage-off phases (blank background) and bias voltage-on phases (hatched background) for different bias voltage frequencies.

FIG. 7 is a diagram illustrating a series of graphs that show the side wall deposition rate on the etching mask during bias voltage-off phases (blank background) and bias voltage-on phases (hatched background) for different bias voltage frequencies. More particularly, graph 710 illustrates the side wall deposition rate with respect to process time for a bias voltage frequency corresponding to Regime X 610, graph 720 illustrates the side wall deposition rate with respect to process time for a bias voltage frequency corresponding to Regime Y 620, and graph 730 illustrates the side wall deposition rate with respect to process time for a bias voltage frequency corresponding to Regime Z 630.

As illustrated in graph 710, at the beginning of the deposition phase, the deposition rate is lower and only increases rapidly after a certain incubation time, which depends on the material properties of the etching mask. Afterwards, during the etching phase, the deposition material is removed during a certain desorption time, which depends on the material properties of the etching mask and on the ions that reach the etching mask due to the bias voltage. If the deposition material were fully desorbed from the surface of the etching mask during the etching phase, an equal incubation time would exist at the start of the next deposition phase. It should be noted that, in the Regime X illustrated in graph 710, both the deposition and etching phase durations are longer than the deposition incubation and desorption times, respectively. Thus, by increasing the bias voltage frequency, the total incubation time increases, and thus the average deposition rate decreases.

In the case of Regime Y illustrated in graph 720, the bias voltage frequency was increased sufficiently to reduce the average deposition compared to regime X, since during most or all of the deposition phase the deposition rate has not yet reached its saturated value. However, in Regime Y, the bias voltage frequency is low enough that the desorption time is shorter than the etching phase.

If the bias voltage frequency is increased, as illustrated in Regime Z in graph 730, the etching phase becomes shorter than the desorption time. In Regime Z, the surface deposition from the previous cycle remains at the beginning of the deposition phase and thus the incubation time is shortened. Therefore, increasing the frequency in this regime results in an increase of the average deposition rate.

As illustrated by the trends of the above-described bias frequency regimes, the side wall deposition rate of the etching mask reaches a minimum at a particular bias frequency. Since the average bias voltage power primarily affects the etching rate of the top of the etching mask, it is possible to control the etching rate on the top of the etching mask by adjusting the average bias voltage power as necessary, and control the etching rate on the side walls of the etching mask by adjusting the bias voltage frequency. For instance, in the case that it is desirable to minimize the changes to the height and width of the etching mask, the average bias voltage that achieves a net etching rate on the top of the etching mask of substantially zero (for example, 32 W as illustrated in FIG. 4), and the bias voltage frequency that achieves the minimum deposition rate on the side walls of the etching mask (for example, approximately 200 Hz as illustrated in FIG. 6) may be used.

Further, in addition to the relationship between the bias voltage frequency and the side wall deposition rate described above with reference to FIG. 7, it was discovered by the present inventors that there exists a relationship between the maximum bias voltage power and the side wall deposition rate of the etching mask. The relationship between the maximum bias voltage power and the side wall deposition rate of the etching mask will be further described with reference to FIG. 8.

Figure 8:
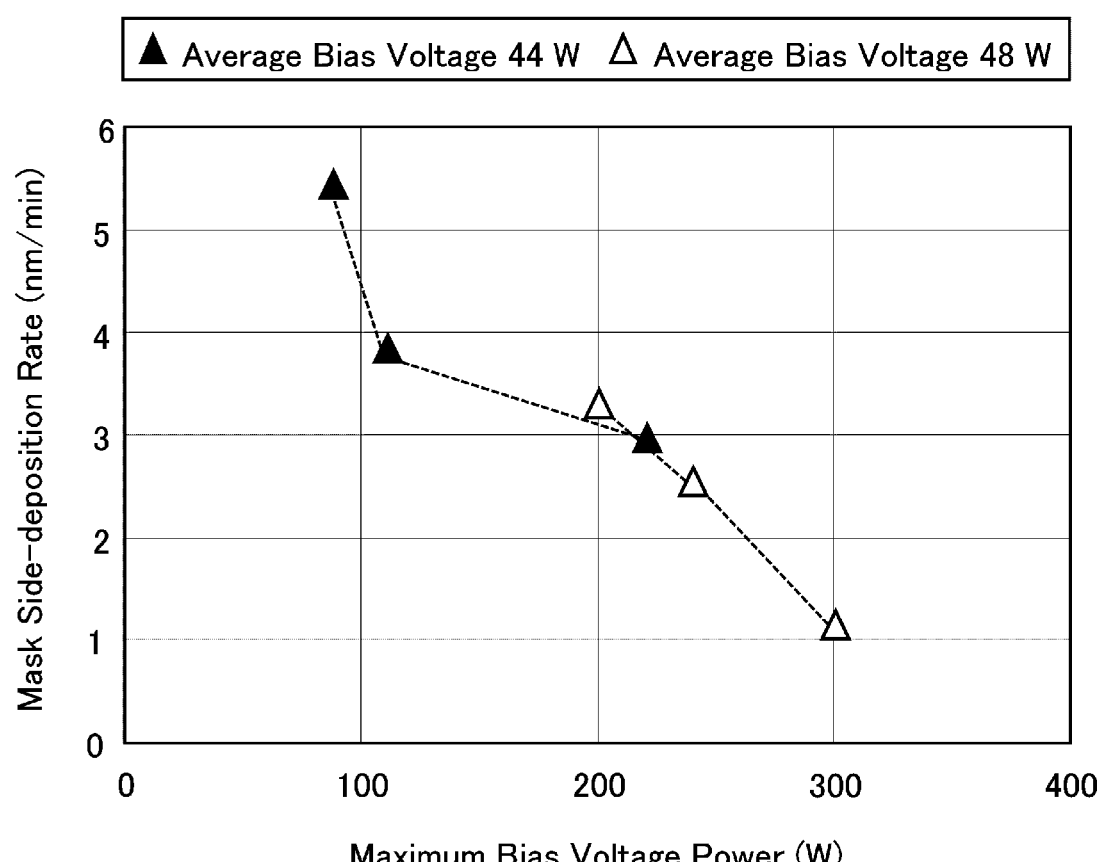
FIG. 8 is a graph illustrating the side-deposition rate of the SOC etching mask at different maximum bias voltage powers at a bias voltage frequency of 100 Hz.

FIG. 8 is a graph illustrating the side-deposition rate of an SOC etching mask at different maximum bias voltage powers at a bias voltage frequency of 100 Hz for two different average bias voltage powers. Here, it should be noted that the maximum bias voltage power referenced here is different from the average bias voltage power, which is the product of the maximum bias voltage power and the duty ratio. Accordingly, the duty ratio was modified as necessary as the maximum bias voltage power was increased to collect the data points for two different average bias voltages of 44 W and 48 W.

As illustrated in FIG. 8, a change in the maximum bias voltage power changes the amount of deposition on the mask walls. More particularly, a greater maximum bias voltage power provides the individual ions of the gas plasma with a larger kinetic energy, resulting in a greater etching rate and a lower effective side wall deposition rate. Although the maximum bias voltage power also affects the etching amount on the top surface of the etching mask, since the side-deposition of the etching mask is more sensitive to the maximum bias voltage power than to the average bias voltage power, the maximum bias voltage power can be used to provide additional control of the side wall deposition rate of the etching mask. For example, the maximum bias voltage may be increased to reduce the side-deposition rate of the etching mask.

Figure 9:
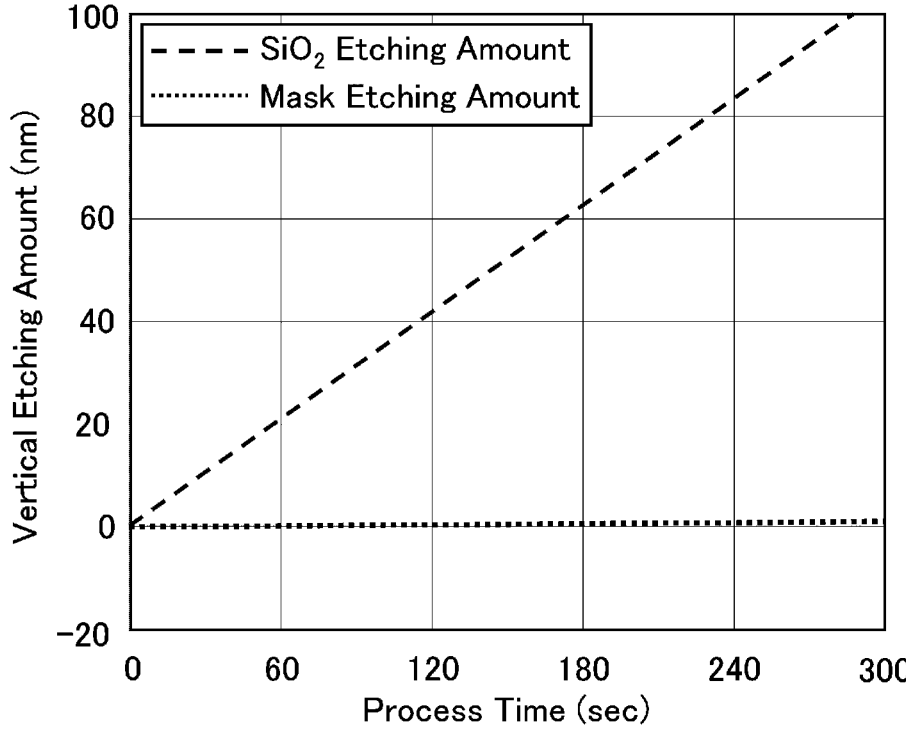
FIG. 9 is a graph of the average etching amount of the target material $SiO_2$ and of the SOC etching mask with respect to the process time, where the process bias voltage power was 229 W, the duty ratio was 14%, and the frequency was 100 Hz.

FIG. 9 is a graph of the average etching amount of the SiO$_2$ etching material and of the SOC etching mask during a plasma processing operation in which the etching parameters were adjusted in accordance with the relationships described above to stabilize the shape of the etching mask. More particularly, FIG. 9 illustrates the average etching amount of the SiO$_2$ etching material and of the SOC etching mask during a plasma processing operation where the process bias voltage power was set to 229 W, the duty ratio was set 14%, and the bias voltage frequency was set to 100 Hz.

As illustrated by FIG. 9, the etching of the SiO$_2$ etching material below the etching mask layer proceeds linearly throughout the plasma processing process, while the etching rate on the top surface of the etching mask is maintained near zero. As a result, the height of the etching mask can be maintained with a desired range throughout the plasma processing operation, yielding a very high etching selectivity (in this present case, an etching selectivity exceeding 80 was achieved).

FIG. 10 is a flowchart illustrating a flow of a parameter adjustment process 100 according to the embodiments of the present disclosure. The flowchart of FIG. 10 summarizes the etching parameter adjustment process 1000 in three stages, in which the etching parameters are set such that deposition takes place on the etching mask material when the average bias voltage power is set to 0 V, and that net etching occurs when the average bias voltage power is set to a sufficiently high value.

In the first stage S1010, the average bias voltage power is set such that a target net etching rate on the top surface of the etching mask is satisfied. Here, the target net etching rate refers to a desired amount of material to be etched from the top surface of the etching mask with respect to time, with reference to the initial height of the etching mask. The target net etching rate may be represented as a particular target value (e.g., 0 nm/min), a threshold value (e.g., less than 1 nm/min), or a target range (e.g., between −1 nm/min and 1 nm/min).

In embodiments, once the plasma processing operation has already been initiated, the average bias voltage power may be set based on the current etching rate on the top surface of the etching mask and the target net etching rate on the top surface of the etching mask. For instance, the average bias voltage power may be increased to increase the etching rate on the top surface of the etching mask and decreased to decrease the etching rate on the top surface of the etching mask. This can be done since the etching rate on the top surface of the etching mask monotonically increases with average bias power, as illustrated by the graph shown in FIG. 4.

Next, in the second stage S1020, the bias voltage frequency and maximum bias voltage power are set such that a target net deposition rate on the side walls of the etching mask is satisfied. Here, the target net deposition rate refers to a desired amount of material to be deposited on the side walls of the etching mask with respect to time, with reference to the initial width of the etching mask. The target net deposition rate may be represented as a particular target value (e.g., 0 nm/min), a threshold value (e.g., less than 1 nm/min), or a target range (e.g., between −1 nm/min and 1 nm/min).

In embodiments, once the plasma processing operation has already been initiated, the bias voltage frequency and the maximum bias voltage power may be set based on the current deposition rate on the side walls of the etching mask and the target net deposition rate on the side walls of the etching mask. For instance, the bias voltage frequency may be set to obtain a minimum side wall deposition rate between different higher rates at high and low frequencies, and the maximum bias voltage power may be increased to decrease the side wall deposition rate or decreased to increase the side wall deposition rate to achieve the target deposition rate. As the characteristic changes due to adjustment of the bias voltage frequency and the maximum bias voltage power are discussed above and illustrated in FIG. 6 to FIG. 8, respectively, a detailed description thereof will be omitted here.

Once again, it should be noted that the maximum bias voltage power can be adjusted independently of the average bias voltage power. However, in the event that the etching rate on the top surface of the etching mask fails to satisfy the target net etching rate after the adjustments of the second stage S1020, the present process returns to the first stage S1010, and the first stage S1010 and the second stage S1020 are repeated until the desired etching rate on the top surface of the etching mask and the desired deposition rate on the side wall of the etching mask are achieved.

In the third stage S1030, the process time of the plasma processing operation is set to satisfy a target etching amount of the etching material (e.g., the $SiO_2$ layer) below the etching mask. Here, the target etching amount refers to a desired amount of material to be etched from the etching material. The target etching amount may be represented as a particular target value (e.g., 5 nm) or a target range (e.g., between 3 nm and 5 nm). In embodiments, the process time may be extended until the predetermined etching amount of the etching material is obtained.

In this way, by setting etching parameters including the average bias voltage power, the bias voltage frequency, and the maximum bias voltage power to satisfy target net etching rates on the top of the etching mask and satisfy target deposition rates on the side walls of the etching mask, the height and width of the etching mask can be controlled with a high degree of accuracy, and a plasma processing operation with a stable etching mask pattern and a high mask selectivity can be obtained even for small pattern sizes (e.g., under 20 nm). Furthermore, as the etching and deposition processes are performed in a combined etching and deposition operation in which both etching and deposition gases are present in the plasma processing chamber, it becomes unnecessary to perform a process gas exchange to switch between etching and deposition gases. As a result, the time delay resulting from this process gas exchange can be avoided, such that the plasma processing operation can be performed in a swift and efficient manner.

It should be noted that, although the previous embodiments were discussed with reference to an example in which the conditions illustrated in Table 1 were used and the etching parameters were adjusted in accordance with the stages described in FIG. 10, depending on the material of the etching mask and the etching material, different process conditions may be appropriate to obtain a process that facilitates stable etching and deposition.

For instance, in the above-described example, although an SOC layer was used as the etching mask, other embodiments of the invention are not limited to this material, but may utilize a different carbon-based material, such as amorphous carbon or diamond-like carbon.

In addition, in the above-described example, although an etching material formed of $SiO_2$ was used, other embodiments of the invention are not limited thereto, but may use masks of SiN. SiON, TiN, or other titan-based metallic hard mask materials.

In addition, in the above-described example, although Ar gas was used as a diluent gas, He, Ne, Kr, Xe, or other gases that can serve as a diluent gas may be used instead. Further, in the above-described example, although $CH_4$ gas was used as the deposition-gas, other embodiments can instead use other deposition gases, such as $C_2H_2$, $C_2H_4$, or other gases containing carbon C and hydrogen H.

In addition, in the above-described example, although $CF_4$ is used as the etching gas for the $SiO_2$ etching material, other embodiments of the disclosure may use $CHF_3$, $C_4F_6$, $C_4F_8$, $SF_6$, or other gases containing fluorine F. Additionally, in some embodiments, the carbon (C) contained in the etching gas may also be employed to contribute to deposition-film formation.

In the above-described embodiments, it was assumed that an ECR (Electron Cyclotron Resonance) etching apparatus using microwaves was used to ignite the plasma. However, the embodiments of the present disclosure are not limited thereto, and further include configurations using different devices, including those that use different principles to support plasma processing, such as, CCP (Capacitively Coupled Plasma), or ICP (Inductively Coupled Plasma), for example.

Further, in the above-described embodiments, an example was described in which the bias voltage applied to the sample was turned on and off during each cycle, but embodiments of the invention include configurations in which the bias voltage is instead alternated between any sufficiently high and low value to facilitate alternating etching and deposition phases.

The present invention may be embodied as a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing.

A computer readable storage medium, as used herein, is not to be construed as being transitory signals per se, such as radio waves or other freely propagating electromagnetic waves, electromagnetic waves propagating through a wave-guide or other transmission media (e.g., light pulses passing through a fiber-optic cable), or electrical signals transmitted through a wire.

Aspects of the present invention are described herein with reference to flowchart illustrations and/or block diagrams of methods, apparatus (systems), and computer program products according to embodiments of the invention. Tt will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

Embodiments according to this disclosure may be provided to end-users through a cloud-computing infrastructure. Cloud computing generally refers to the provision of scalable computing resources as a service over a network. More formally, cloud computing may be defined as a computing capability that provides an abstraction between the computing resource and its underlying technical architecture (e.g., servers, storage, networks), enabling convenient, on-demand network access to a shared pool of configurable computing resources that can be rapidly provisioned and released with minimal management effort or service provider interaction. Thus, cloud computing allows a user to access virtual computing resources (e.g., storage, data, applications, and even complete virtualized computing systems) in "the cloud," without regard for the underlying physical systems (or locations of those systems) used to provide the computing resources.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing is directed to exemplary embodiments, other and further embodiments of the invention may be devised without departing from the basic scope thereof, and the scope thereof is determined by the claims that follow. The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to explain the principles of the embodiments, the practical application or technical improvement over technologies found in the marketplace, or to enable others of ordinary skill in the art to understand the embodiments disclosed herein.

The terminology used herein is for the purpose of describing particular embodiments only and is not intended to be limiting of the various embodiments. As used herein, the singular forms "a," "an," and "the" are intended to include the plural forms as well, unless the context clearly indicates otherwise. "Set of," "group of," "bunch of," etc. are intended to include one or more. It will be further understood that the terms "includes" and/or "including," when used in this specification, specify the presence of the stated features, integers, steps, operations, elements, and/or components, but do not preclude the presence or addition of one or more other features, integers, steps, operations, elements, components, and/or groups thereof. In the previous detailed description of exemplary embodiments of the various embodiments, reference was made to the accompanying drawings (where like numbers represent like elements), which form a part hereof, and in which is shown by way of illustration specific exemplary embodiments in which the various embodiments may be practiced. These embodiments were described in sufficient detail to enable those skilled in the art to practice the embodiments, but other embodiments may be used and logical, mechanical, electrical, and other changes may be made without departing from the scope of the various embodiments. In the previous description, numerous specific details were set forth to provide a thorough understanding the various embodiments. But, the various embodiments may be practiced without these specific details. In other instances, well-known circuits, structures, and techniques have not been shown in detail in order not to obscure embodiments.

REFERENCE SIGNS LIST

100 . . . Plasma processing device, 101 . . . Vacuum container. 102 . . . Shower plate, 103 . . . Dielectric window, 104 . . . Plasma processing chamber. 105 . . . Gas supply device. 106 . . . Vacuum exhaust device. 107 . . . Waveguide, 109 . . . Electromagnetic wave generating power supply, 110 . . . Magnetic field generating coil. 111 . . . Sample mounting electrode, 112 . . . Wafer, 113 . . . Matching circuit, 114 . . . Radio frequency bias power supply. 115 . . . Radio frequency filter, 116 . . . DC power supply, 117 . . . Exhaust on-off valve. 118 . . . Exhaust rate variable valve, 119 . . . Matching unit, 120 . . . Control unit, 121 . . . Pulse generating unit. 201 . . . Substrate, 202 . . . Etching material, 203 . . . Etching mask. 204 . . . Accelerated ions, 205 . . . Thin deposition layer, 610 . . . Regime X, 620 . . . Regime Y, 630 . . . Regime Z, 710, 720, 730 . . . Graphs. 1000 . . . Parameter adjustment process

The invention claimed is:

1. A plasma processing method comprising:

providing, to a sample stage within a plasma processing chamber, a wafer including a substrate having an etching mask disposed on a target layer to be etched;

providing a process gas to the plasma processing chamber to facilitate etching and deposition with respect to the wafer;

performing a combination etching and deposition operation with respect to the wafer in which a bias voltage supplied to the sample stage with a first bias voltage frequency is modified between a first voltage value and a second voltage value lower than the first voltage value so as to satisfy a target net etching rate with respect to a top surface portion of the etching mask and a target net deposition rate with respect to a side wall portion of the etching mask; and setting the target net etching rate and the target net deposition rate such that a rate of change to a height of the etching mask and a rate of change to a width of the etching mask are less than or equal to 1 nanometer per minute.

2. The plasma processing method according to claim 1, further comprising:

setting, based on a current etching rate with respect to the top surface portion of the etching mask, an average power of the bias voltage to satisfy the target net etching rate.

3. The plasma processing method according to claim 2, further comprising:

setting, based on a current deposition rate with respect to the side wall portion of the etching mask, the first bias voltage frequency to satisfy the target net deposition rate.

4. The plasma processing method according to claim 3, further comprising:

setting, based on the current deposition rate with respect to the side wall portion of the etching mask, the first voltage value of the bias voltage to a maximum power value that satisfies the target net deposition rate; and setting the second voltage value of the bias voltage to a zero value.

5. The plasma processing method according to claim 4, further comprising:

setting a process time for the combination etching and deposition process so as to satisfy a target etching amount.

6. The plasma processing method according to claim 1, wherein the process gas includes a diluent gas, a deposition gas, and an etching gas.

7. The plasma processing method according to claim 6, wherein a gas flow rate of the etching gas is 3-15 times a gas flow rate of the deposition gas.

8. A plasma processing device comprising:

a plasma processing chamber;

a sample stage arranged within the plasma processing chamber for placing a wafer including a substrate having an etching mask disposed on a target layer to be etched;

a gas supply device for providing a process gas to the plasma processing chamber to facilitate etching and deposition with respect to the wafer;

an electromagnetic wave generating power supply for generating plasma in the plasma processing chamber to perform a combination etching and deposition process with respect to the wafer; and a control unit for modifying, with a first bias voltage frequency, a bias voltage supplied to the sample stage between a first voltage value and a second voltage value lower than the first voltage value so as to satisfy a target net etching rate with respect to a top surface portion of the etching mask and a target net deposition rate with respect to a side wall portion of the etching mask;

wherein the control unit sets the target net etching rate and the target net deposition rate such that a rate of change to a height of the etching mask and a rate of change to a width of the etching mask are less than or equal to 1 nanometer per minute.

* * * * *